US008975644B2

(12) United States Patent
Homewood et al.

(10) Patent No.: US 8,975,644 B2
(45) Date of Patent: Mar. 10, 2015

(54) OPTOELECTRONIC DEVICES

(75) Inventors: Kevin Peter Homewood, Surrey (GB);
Russell Mark Gwilliam, Surrey (GB)

(73) Assignee: The University of Surrey, Surrey (GB)

( * ) Notice: Subject to any disclaimer, the term of this patent is extended or adjusted under 35 U.S.C. 154(b) by 0 days.

(21) Appl. No.: 13/988,611

(22) PCT Filed: Nov. 21, 2011

(86) PCT No.: PCT/EP2011/070526
§ 371 (c)(1),
(2), (4) Date: May 21, 2013

(87) PCT Pub. No.: WO2012/069397
PCT Pub. Date: May 31, 2012

(65) Prior Publication Data
US 2013/0250991 A1 Sep. 26, 2013

(30) Foreign Application Priority Data

Nov. 22, 2010 (GB) .................................. 1019725.9

(51) Int. Cl.
*H01L 27/15* (2006.01)
*H01L 29/26* (2006.01)
(Continued)

(52) U.S. Cl.
CPC ............ *H01L 31/0288* (2013.01); *H01L 33/34* (2013.01); *H01L 33/343* (2013.01); *H01S 5/305* (2013.01); *H01L 31/103* (2013.01); *H01L 31/105* (2013.01); *H01L 31/107* (2013.01); *H01L 31/108* (2013.01);
(Continued)

(58) Field of Classification Search
USPC ........................ 257/79, 13, 80–103, 191, 918,
257/E51.018–E51.022, E33.001–E33.077,
257/E33.058, E31.063, E31.115,
257/E27.133–E27.139; 438/22–47, 69,
438/493, 503, 507, 956
See application file for complete search history.

(56) References Cited

U.S. PATENT DOCUMENTS 6,288,415 B1 9/2001 Leong et al.
6,433,399 B1 8/2002 Polman et al.
(Continued)

FOREIGN PATENT DOCUMENTS

| JP | 2005 347465 | 12/2005 |
| JP | 2006 135208 | 5/2006 |
| JP | 2006 332490 | 12/2006 |

OTHER PUBLICATIONS

Lourenco M A et al: "Silicon-based light emitting devices", Vacuum, Pergamon Press, GB, vol. 78, No. 2-4, May 30, 2005, pp. 551-556, XP027613070, ISSN 0042-207X.*
(Continued)

*Primary Examiner* — Dao H Nguyen
*Assistant Examiner* — Tram H Nguyen
(74) *Attorney, Agent, or Firm* — Nicholas B. Trenkle; Stites & Harbison PLLC

(57) ABSTRACT

Optoelectronic devices have a photoactive region containing semiconductor material doped with ions of a rare earth element. Characteristic transitions associated with internal energy states of the rare earth dopant ions are modified by direct interaction of those states with an energy state in the semiconductor band structure. $Eu^+$ and $Yb^+$ doped silicon LEDs and photodetectors are described. The LEDs are emissive of radiation in the wavelength range 1300 nm to 1600 nm, important in optical communications.

56 Claims, 7 Drawing Sheets

Figure 1:
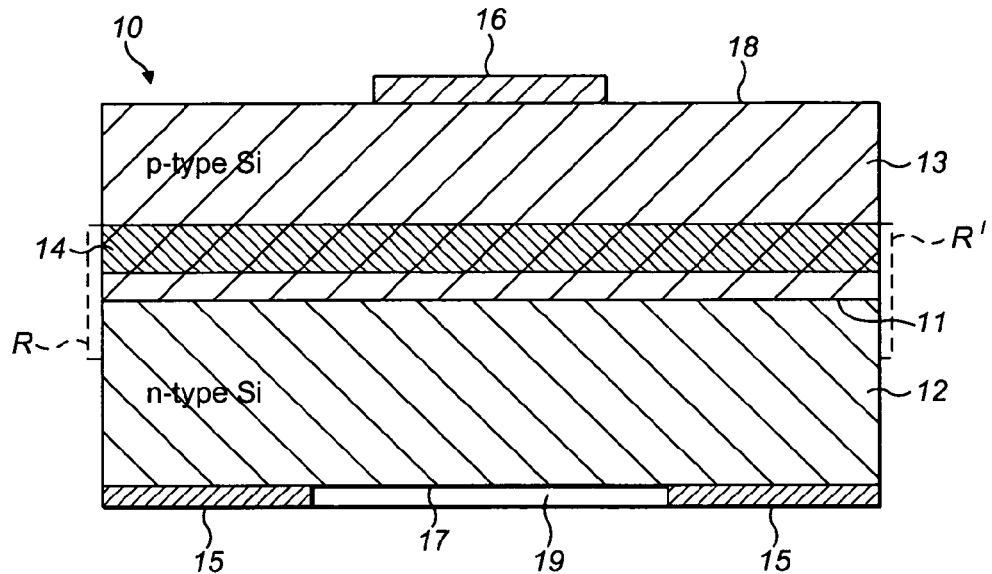

(51) Int. Cl.
  *H01L 31/12* (2006.01)
  *H01L 33/00* (2010.01)
  *H01L 31/0288* (2006.01)
  *H01L 33/34* (2010.01)
  *H01S 5/30* (2006.01)
  *H01L 31/103* (2006.01)
  *H01L 31/105* (2006.01)
  *H01L 31/107* (2006.01)
  *H01L 31/108* (2006.01)
  *H01S 3/16* (2006.01)

(52) U.S. Cl.
  CPC ............ *H01S 3/1628* (2013.01); *H01S 3/1603* (2013.01); *H01S 3/1618* (2013.01); *Y02E 10/50* (2013.01)
  USPC .......................................................... 257/79

(56) References Cited

U.S. PATENT DOCUMENTS

| | | |
|---|---|---|
| 7,274,041 B2 | 9/2007 | Homewood et al. |
| 2002/0048289 A1 | 4/2002 | Atanackovic et al. |
| 2003/0150376 A1 | 8/2003 | Homewood et al. |
| 2004/0214362 A1 | 10/2004 | Hill et al. |
| 2004/0252738 A1 | 12/2004 | Hill |
| 2005/0051777 A1* | 3/2005 | Hill ................................ 257/72 |

OTHER PUBLICATIONS

Castagna M E et al: "High efficiency light emitting devices in silicon", Materials Science and Engineering B, Elsevier Sequoia, Lausanne, CH, vol. 105, No. 1-3, Dec. 15, 2003, pp. 83-90, XP004518424, ISSN: 0921-5107, DOI: 10.1016/J.MSEB.2003.08.021.*

International Search Report for PCT/EP2011/070526 dated Jun. 27, 2012.

Lourenco M A et al: "Silicon-based light emitting devices", Vacuum, Pergamon Press, GB, vol. 78, No. 2-4, (May 30, 2005) pp. 551-556.

Castagna M E et al: "High efficiency light emitting devices in silicon", Materials Science and Engineering B, Elsevier Sequoia, Lausanne, CH, vol. 105, No. 1-3, (Dec. 15, 2003) pp. 83-90.

Written Opinion of the International Searching Authority for PCT/EP2011/070526 dated Jun. 27, 2012.

Invitation to Pay Additional Fees and, Where Applicable Protest Fee for PCT/EP2011/070526 dated Apr. 5, 2012.

GB Search Report for GB1019725.9 Dated Mar. 9, 2011.

"Optical Spectroscopy of $Eu^{3+}$ Doped ZnO Nanocrystals", Yongsheng Liu et al, J. Phys. Chem. C 2008, 112, 686-694.

"Silicon light emitting diodes emitting over the 1.2-1.4μm wavelength region in the extended optical communication band" M.A. Lourenco et al, Applied Physics Letters 92, 161108 (2008).

* cited by examiner

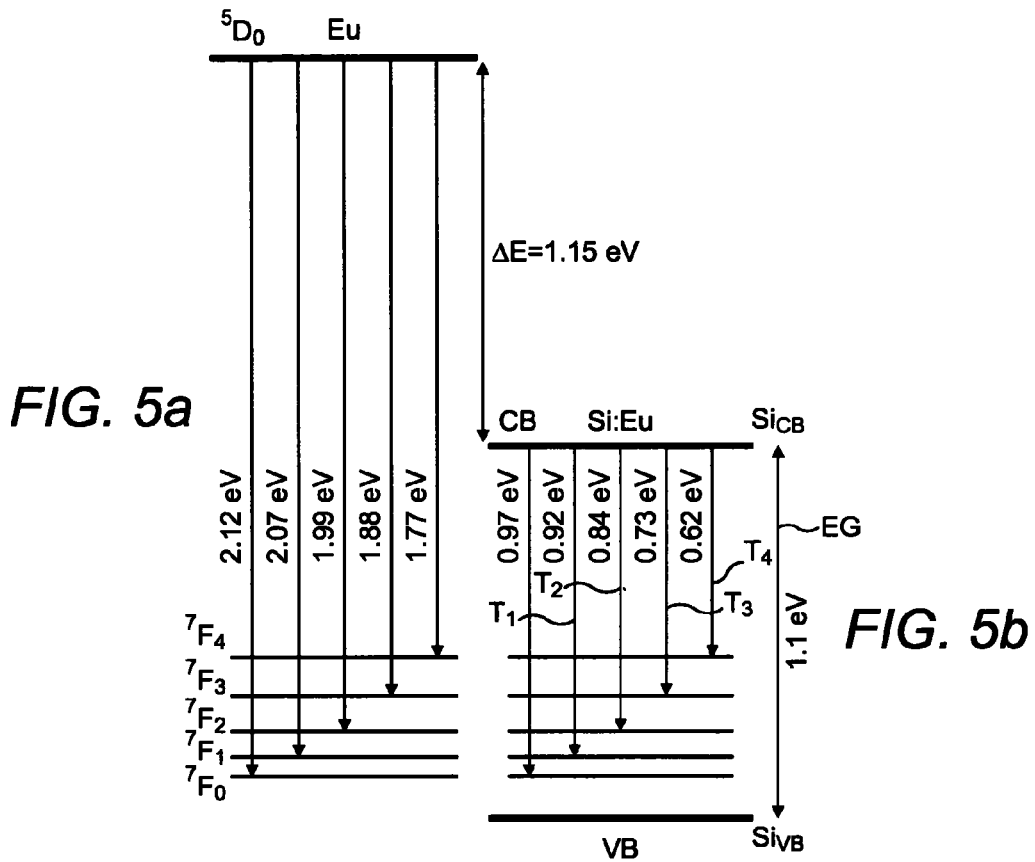
FIG. 5a
FIG. 5b
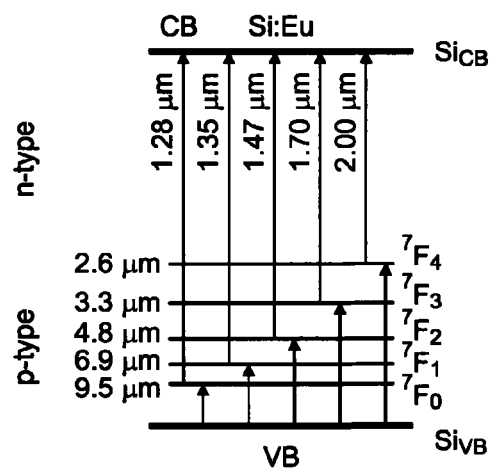
FIG. 6

OPTOELECTRONIC DEVICES

This invention relates to optoelectronic devices; particularly, though not exclusively, silicon-based optoelectronic devices.

There is an increasing need to develop silicon-based optoelectronic devices, particularly optical sources, such as optical emitters and optical amplifiers, with a view to implementing fully integrated silicon photonic platforms. However, silicon is an indirect band gap semiconductor material in which fast, non-radiative recombination of charge carriers is the dominant process, and this has tended to hamper the development of such silicon-based devices. A range of different approaches has been adopted with a view to alleviating this problem.

U.S. Pat. No. 7,274,041B2 describes an optoelectronic device manufactured from silicon incorporating a strain field created by an array of dislocation loops. The strain field is effective to spatially confine, and thereby promote radiative recombination of charge carriers.

U.S. Pat. No. 6,288,415B1 discloses a different approach whereby a direct band gap semiconductor material, which provides a fast, radiative route, is introduced into a silicon host.

Rare earth elements have also been considered promising as optical centres for the development of optical sources. The partially filled 4f shell gives rise to sharp transitions between internal energy states of the rare earth element atoms. These transitions are known to be highly insensitive to the crystal host and to temperature variation, and many such transitions are known to exhibit intrinsic gain and do support lasing in other host materials.

"Silicon-based light emitting devices", M. A. Lourenco et al Vacuum 78 (2005) 551-556 discloses a light emitting diode comprising a silicon host doped with ions of the rare earth element erbium (Er). This device is reported as being emissive of radiation in the infra-red part of the electromagnetic spectrum, principally at the wavelength 1555 nm.

Similarly, "Silicon light emitting diodes emitting over the 1·2-1·4 μm wavelength region in the extended optical communication band", M. A. Lourenco et al, Applied Physics Letters, 92, 161108 (2008) describes a light emitting diode comprising a silicon host doped with ions of the rare earth element thulium (Tm). Again, the device is emissive of radiation in the infra-red; that is, at wavelengths in the range 1200 nm and 1350 nm, attributable to radiative transitions between the lowest excited energy states and the ground state of the thulium ions.

Yongsheng Liu et al, J. Phys. Chem. C 2008, 112, 686-694 describes a light emitting diode in which trivalent ions of the rare earth element europium ($Eu^{3+}$) are implanted in ZnO nanocrystals, which has a much wider band gap than silicon. In this case, the device is found to be emissive of radiation in the visible part of the electromagnetic spectrum; specifically, in the red-yellow region of the visible. Again, the observed luminescence is attributable to well known, characteristic transitions between internal energy states of the ($Eu^{3+}$) ions; that is, transitions between the excited $^5D_o$ energy state and the $^7F_j$ energy states, where j=0 to 6, the dominant red emission, at the wavelength 615 nm, being attributable to the $^5D_0$-$^7F_2$ transition.

In each case, the observed luminescence is attributable to transitions between internal energy states of the rare earth element dopant ions. These transitions are excited by indirect energy transfer processes due to recombination of charge carriers in the semiconductor host, and this tends to reduce emission rates.

According to one aspect of the invention there is provided an optoelectronic device having a photoactive region containing semiconductor material doped with ions of a rare earth element, such that, in operation of the device, characteristic transitions associated with internal energy states of the dopant ions are modified by direct interaction of those internal energy states with an energy state from the conduction and/or valence band of the semiconductor material.

According to another aspect of the invention there is provided an optoelectronic device including a photoactive region containing semiconductor material doped with ions of a rare earth element, said ions having energy states that lie within a forbidden band between the conduction and valence bands of the semiconductor material, and being capable, in operation, of undergoing radiation emissive or radiation absorptive transitions between an energy band of the semiconductor material and a said energy state of the dopant ions.

Devices according to the invention involve direct interaction between an energy band or bands of the semiconductor host material and one or more energy state of the dopant ions, and so do not rely on indirect energy transfer processes that are needed in conventional devices of the kind described.

In some preferred embodiments, the rare earth element dopant ions have internal states differing in energy by more than the bandgap of the semiconductor host material.

Preferably, the semiconductor material is silicon, although other indirect band gap materials could be used; for example, other Group IV materials such as germanium; tin; carbon; silicon-germanium; silicon carbide and their alloys.

In an embodiment, said ions of a rare earth element are trivalent europium ions, $Eu^{3+}$, although ions of other rare earth elements may be used; for example, trivalent ions of the rare earth element ytterbium, $Yb^{3+}$.

In a preferred embodiment, the photoactive region of the optoelectronic device contains silicon doped with trivalent europium ions and the device is capable of undergoing radiative transitions from an energy state in the silicon conduction band to one or more of the $^7F_j$ states of the trivalent $Eu^{3+}$ ions, where j=0, 1, 2, 3, 4. In this embodiment, the optoelectronic device is emissive of radiation in the infra-red part of the electromagnetic spectrum, specifically in the wavelength range from 1300 nm-1600 nm. Luminescence in this wavelength range is entirely unexpected because conventional devices incorporating europium ions are all emissive of radiation in the visible part of the electromagnetic spectrum, attributable to characteristic transitions between internal energy states of the dopant ions. Furthermore, luminescence in the infra-red wavelength range 1300 nm-1600 nm is of considerable importance to applications involving development of optical fibre communication systems.

The optoelectronic device may be a photoemitter including light emitting diodes and lasers. In other embodiments of the invention, the optoelectronic device is an optical amplifier.

In other embodiments of the invention, the optoelectronic device is a photodetector.

In a typical implementation, an optoelectronic device according to the invention may be incorporated in an optoelectronic integrated circuit, such as a silicon-on-insulator waveguide platform.

Figure 2:
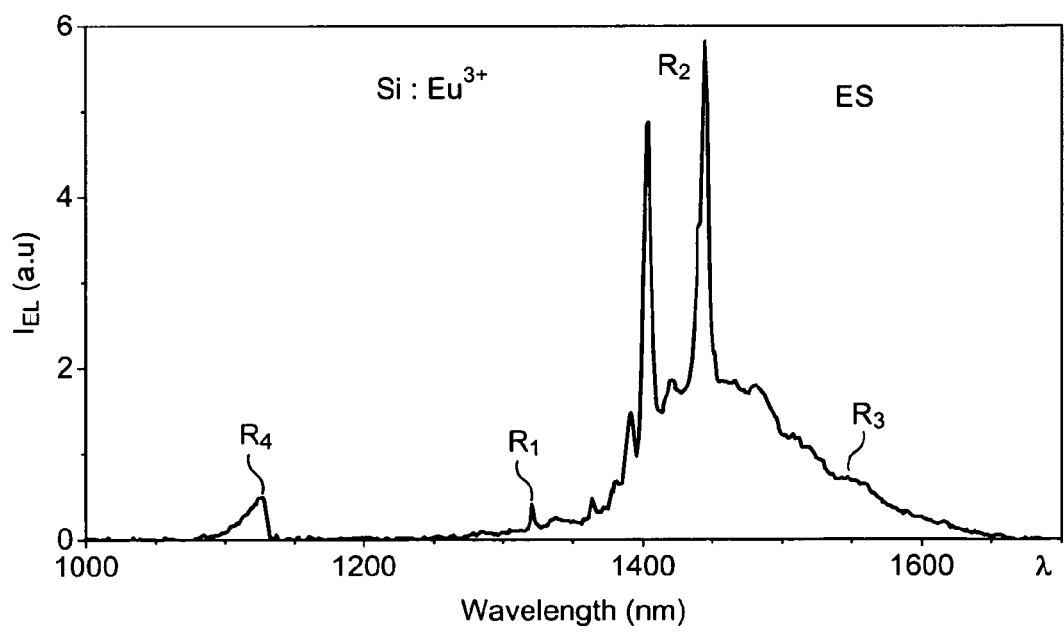
Figure 3:
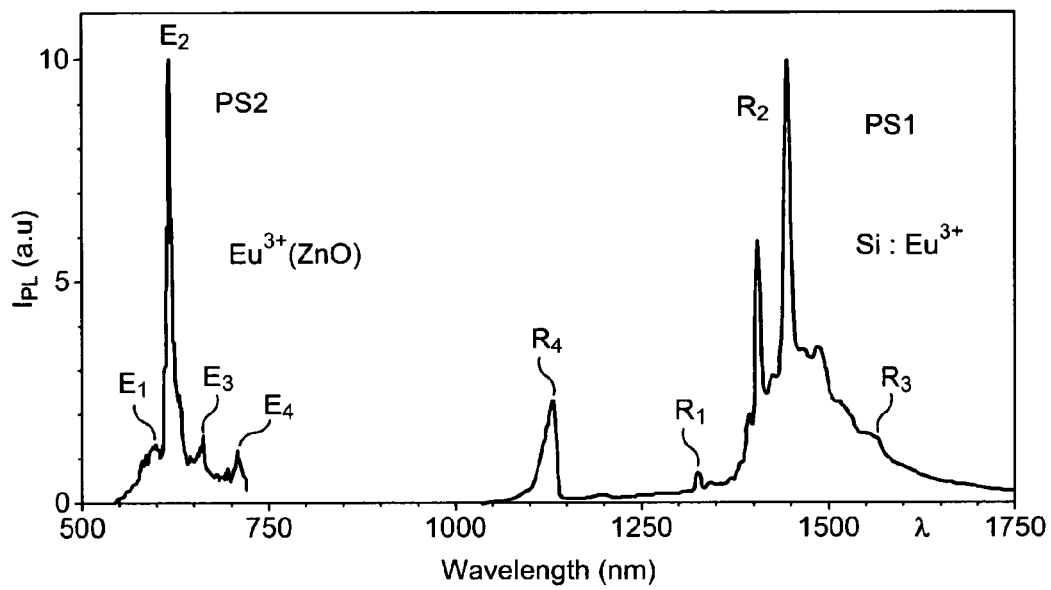
Figure 4:
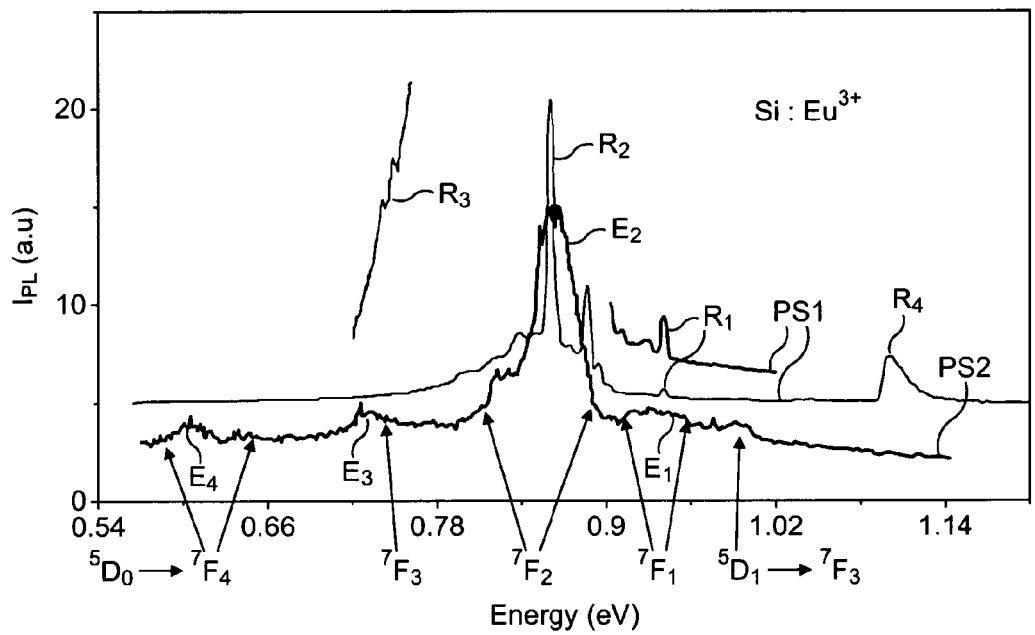

Embodiments of the invention are now described, by way of example only, with reference to the accompanying drawings, of which:

FIG. 1 shows a schematic, transverse sectional view through a light emitting diode (LED) according to the invention, FIG. 2 shows an electroluminescence spectrum (ES) obtained by measuring emissions from the LED of FIG. 1, FIG. 3 shows a photoluminescence spectrum (PS1) obtained by measuring emissions from the same LED and a photoluminescence spectrum (PS2) obtained by measuring emissions attributable to transitions between internal energy states of $Eu^{3+}$ ions, FIG. 4 shows the photoluminescence spectra PS1 and PS2 of FIG. 3 replotted as a function of energy (eV), FIG. 5a diagrammatically illustrates transitions between internal energy states of $Eu^{3+}$ ions, FIG. 5b diagrammatically illustrates the relationship between the internal $^7F_j$ energy states of $Eu^{3+}$ ions and the band structure of silicon, FIG. 6 diagrammatically illustrates radiation absorptive transitions, at 80K between energy states of the silicon host and internal energy states of $Eu^{3+}$ dopant ions.

Figure 7:
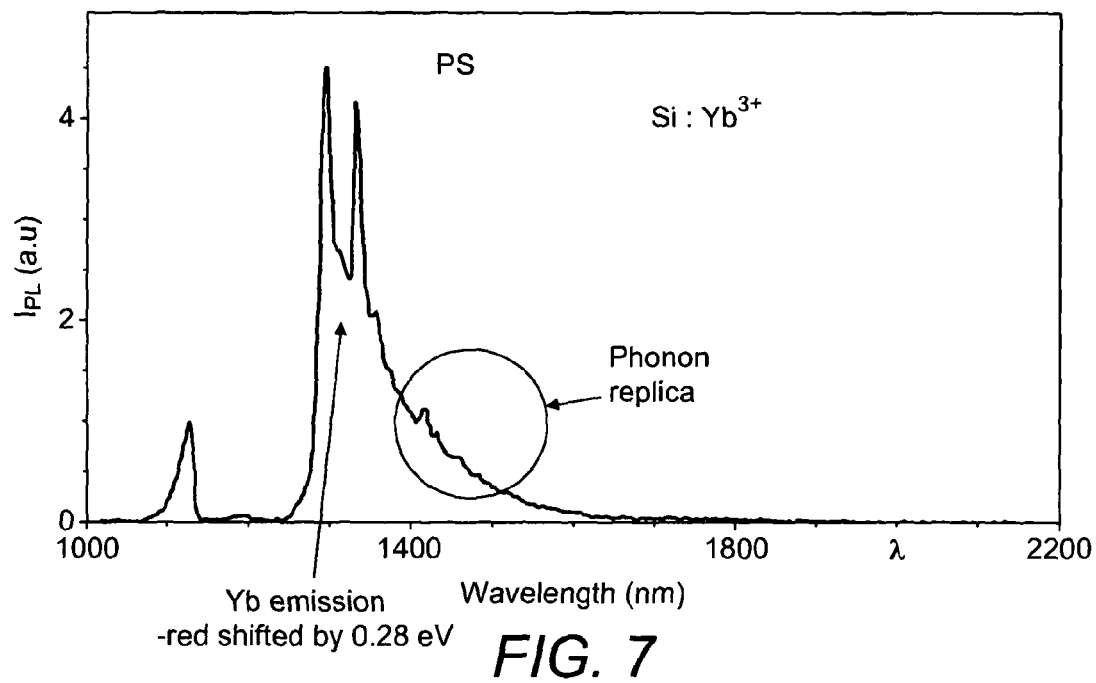

FIG. 7 shows a photoluminescence spectrum obtained from the LED of FIG. 1 in which the $Eu^{3+}$ ions have been replaced by trivalent ions of the rare earth element ytterbium, $Yb^{3+}$.

Figures 8A, 8B:
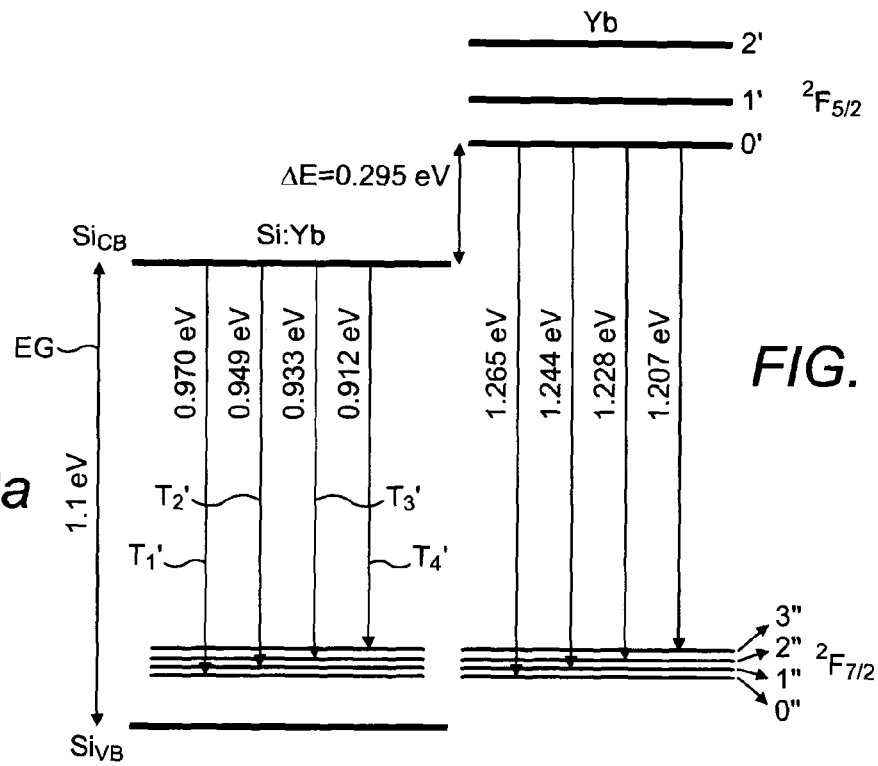
Figure 9:
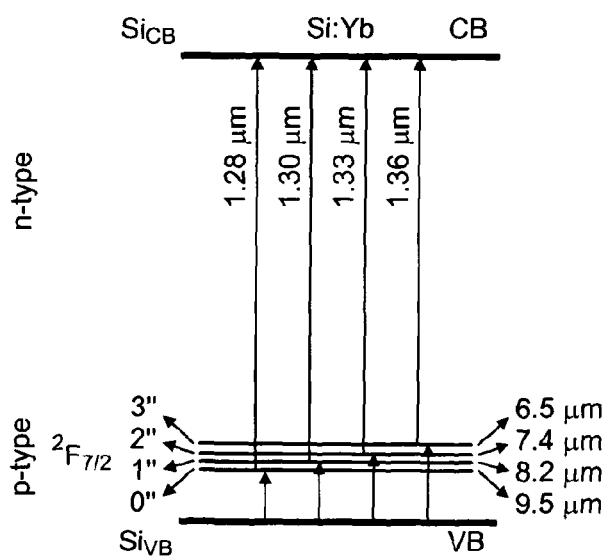
Figure 10:
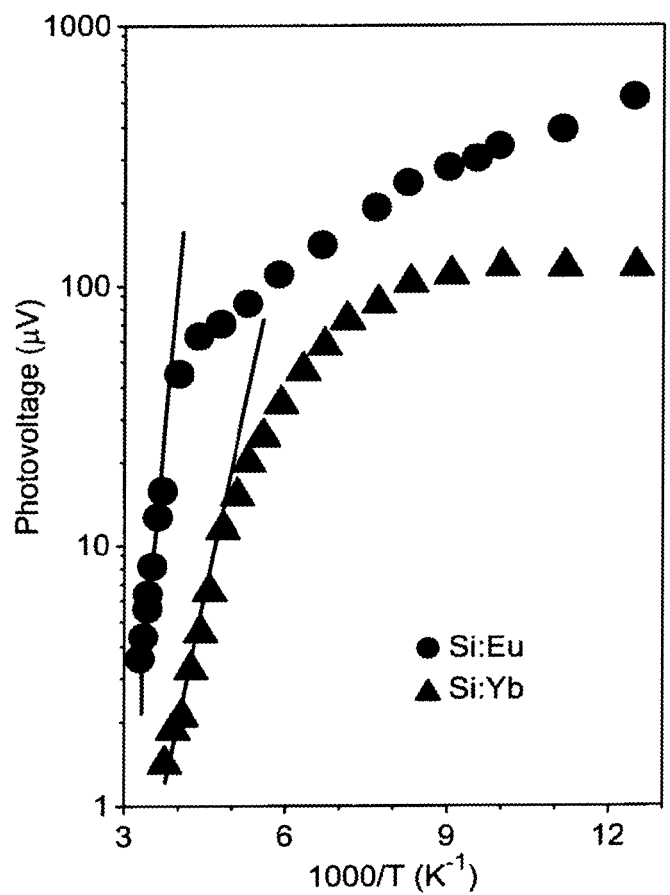
Figure 11A:
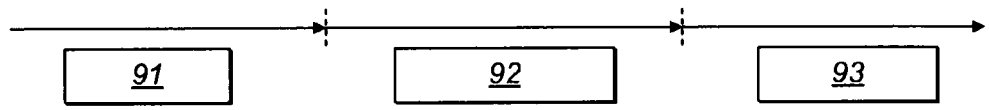
Figure 11B:
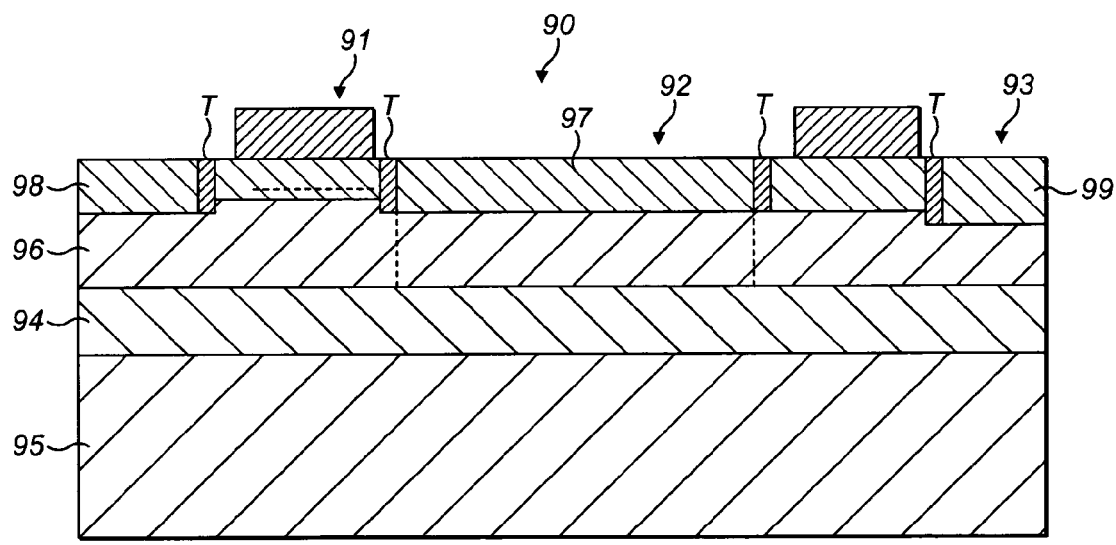

FIG. 8a diagrammatically illustrates transitions between internal energy states of $Yb^{3+}$ ions, FIG. 8b diagrammatically illustrates the relationship between the internal $^2F_{7/2}$ energy states of the $Yb^{3+}$ ions and the band structure of silicon, FIG. 9 diagrammatically illustrates radiation absorptive transitions, at 80K, between energy states of the silicon host and internal energy states of $Yb^{3+}$ ions, FIG. 10 shows photovoltage responses, plotted logarithmically against inverse temperature, obtained from $Eu^{3+}$- and $Yb^{3+}$-doped silicon LEDS according to the invention, and FIGS. 11(a) and 11(b) show an optoelectronic integrated circuit incorporating an optoelectronic device according to the invention.

Referring now to FIG. 1, the optoelectronic device 10 has the form of a light emitting diode (LED). The LED has a p-n junction 11 defined by a region 12 of n-type silicon and a region 13 of p-type silicon. In this embodiment, region 12 is doped with phosphorus atoms (P) and region 13 is doped with boron atom (B). However, it will be appreciated that other suitable dopants known to these skilled in the art could alternatively be used.

The LED also has a photoactive region 14 situated in the region 13 of p-type silicon, as close as possible to a depletion region of the p-n junction at zero bias. In this embodiment, the p-type silicon of region 13 is doped with trivalent ions of the rare earth element europium $Eu^{3+}$ to form the photoactive region 14.

Ohmic contacts 15, 16 are provided on the front and back surfaces 17, 18 of the device, enabling a bias voltage to be applied across the p-n junction. In this embodiment, the ohmic contact 15, provided on the front surface 17, is made from aluminium (Al) and the ohmic contact 16, provided on the back surface 18, is made from eutectic gold/antimony alloy (AuSb). Contact 15 has a central window 19 through which luminescence produced by the device can pass.

The LED also incorporates a strain field located within, or in the vicinity of, the photoactive region 14. In this embodiment, the strain field is created by extended intrinsic lattice defects in the form of an array of dislocation loops. The purpose of this strain field will be explained in greater detail later.

The device 10 was fabricated by implanting boron atoms into a device grade, n-type silicon substrate having a resistance typically in the range 2 to 4 Ohm-cm. The implantation dose was $10^{15}$ Bcm$^{-2}$ and the implantation energy was 30 keV; however, it will be appreciated that implantation doses typically in the range $10^{12}$ to $10^{17}$ Bcm$^{-2}$, and implantation energies typically in the range 10-80 keV could alternatively be used. The implanted boron atoms serve dual functions; that is, they are used as the dopant atoms defining p-type region 13 of the p-n junction 11 and they also create dislocations which can be used to form dislocation loops in that region. The substrate was subsequently implanted with $Eu^{3+}$ ions to form the photoactive region 14. The implantation dose was $10^{13}$ $Eu^{3+}$ cm$^{-2}$ and the implantation energy was 400 keV; however, implantation doses in the range $10^{12}$ to $10^{14}$ $Eu^{3+}$ cm$^{-2}$, and implantation energies in the range to 1 keV to 100 MeV could alternatively be used.

Following implantation, the substrate was subjected to Rapid Thermal Annealing (RTA) in ambient nitrogen at 950° C. for 1 minute. The ohmic contacts were then applied by evaporation, or another suitable deposition process, and sintered at 360° C. for about 2 minutes.

The RTA process activates the implanted boron atoms and also causes aggregation of silicon interstitials created by the implanted boron atoms, leading to the formation of dislocation loops. As described in "Silicon-based light emitting devices", M. A. Lourenco et al, Vacuum 78 (2005) 551-556, the RTA process can be tailored to control the depth and extent of dislocation loop arrays formed in this manner.

Photoluminescence (PL) and electroluminescence (EL) measurements were carried out at temperatures in the range 10K to room temperature. To that end, the LED was mounted in a variable temperature, continuous-flow liquid nitrogen cryostat placed in front of a conventional 1 meter spectrometer. A liquid nitrogen cooled germanium p-i-n diode was used to detect luminescence in the wavelength range from 1000 nm to 1700 nm and a liquid nitrogen cooled extended InGaAs detector was used to detect luminescence in the wavelength range from 1600 nm to 2300 nm.

EL was excited by applying a forward bias voltage (V) to the LED at a current density of 1.25 Acm$^{-2}$, whereas PL was excited by exposing the LED to light produced by an argon laser at an excitation wavelength of 514 nm.

FIG. 2 shows an electroluminescence spectrum (ES) obtained by measuring emissions from the LED described with reference to FIG. 1, at a temperature of 80K. The electroluminescence intensity, $I_{EL}$ is plotted as a function of wavelength λ.

The spectrum has several distinct emission regions, referenced $R_1$, $R_2$ and $R_3$ on a broad background signal. Each such emission region contains one, or a group of emission peaks. As will be explained, these emission regions are thought to be associated with internal states of the $Eu^{3+}$ ions, whereas a fourth region in the spectrum, referenced $R_4$, is attributable to band-band recombination of charge carriers in the silicon host.

FIG. 3 shows a photoluminescence spectrum (PS1), on the right of the Figure, obtained by measuring emissions from the same LED at the same temperature. Again, the photoluminescence intensity $I_{PL}$, is plotted as a function of wavelength λ. As can be seen, the photoluminescence spectrum (PS1) shown in this Figure is substantially the same, in terms of structural detail, as the electroluminescence spectrum (ES) shown in FIG. 2. Also shown in FIG. 3, for comparison, is a photoluminescence spectrum (PS2), on the left of the Figure, obtained by measuring the characteristic emissions attributable to transitions between internal energy states of $Eu^{3+}$ ions; that is, transitions between the excited $^5D_0$ state and the lower energy, $^7F_j$ states, where j=0, 1, 2, 3 and 4. These transitions, and their respective emission energies, are diagrammatically illustrated in FIG. 5a.

The photoluminescence spectrum (PS2), shown in FIG. 3, was obtained from a sample of zinc oxide (ZnO) implanted with $Eu^{3+}$ ions, as reported in Yongsheng Liu et al, J. Phys. Chem. C 2008, 112, 686-694. ZnO was chosen as the host material for the comparison because the $Eu^{3+}$ ions occupy lattice sites having the same tetrahedral symmetry as the lattice sites occupied by $Eu^{3+}$ ions in silicon.

The photoluminescence spectrum (PS2) obtained in this way has four distinct emission regions referenced $E_1$, $E_2$, $E_3$ and $E_4$, these regions being attributable to transitions between the excited $^5D_0$ state and the lower energy, $^7F_1$, $^7F_2$, $^7F_3$ and $^7F_4$ states respectively.

A comparison of the two spectra PS1, PS2 shown in FIG. 3 shows that they have similar structural characteristics; however, it is immediately apparent that the emission regions of spectrum PS1 occur at much longer wavelengths (i.e. lower energies) than do the emission regions of spectrum PS2. More specifically, the emission regions of spectrum PS1 occur at wavelengths in the infra-red region of the electromagnetic spectrum (i.e. at wavelengths in the range 1300 nm-1600 nm), whereas the emission regions of spectrum PS2 occur at wavelengths in the visible region of the electromagnetic spectrum (i.e. at wavelengths in the red-yellow part of the visible spectrum).

This observation was entirely unexpected because known common semiconductor devices incorporating $Eu^{3+}$ ions are all emissive of radiation in the visible part of the electromagnetic spectrum, attributable to the characteristic transitions between internal energy states of the $Eu^{3+}$ ions. Remarkably, it is as though emissions associated with the internal energy states of the $Eu^{3+}$ ions have been subjected to a red-shift, from the visible to the infra-red region of the electromagnetic spectrum. Furthermore, as already explained, the characteristic transitions between internal energy states of the dopant ions are fed by indirect energy transfer processes due to band-to-band, recombination of charge carriers in the semiconductor host. However, in the case of $Eu^{3+}$ ions, the energy differences between the $^5D_0$ state and the $^7F_j$ states are all much larger than the silicon band gap which is only 1·1 eV, and so it had been expected that radiative emissions would be entirely absent, even in the visible.

In FIG. 4, the photoluminescence spectrum (PS1) of FIG. 3 has been replotted as a function of energy, and superimposed on this is the spectrum (PS2) from the same Figure, also plotted as a function of energy, but suitably normalised and red-shifted along the energy axis, by 1·15 eV, so that the dominant emission region, $E_2$, attributable to the $^5D_0$-$^7F_2$ transition, is aligned with the main emission region, $R_2$, of spectrum PS1.

Each $^7F_j$ state, shown in FIG. 5a, consists of a manifold of discrete levels and so each emission region in spectrum PS2 is spread over a narrow energy range and may include several distinct emission peaks, as shown in FIG. 4. It is evident from FIG. 4, that there is strong correlation between other emission regions of the two replotted spectra, in terms of both position and intensity; that is, region $E_1$ is substantially coincident with region $R_1$ (shown on a magnified (×5) scale) and region $E_3$ is substantially coincident with region $R_3$ (shown on a magnified (×50) scale). Furthermore, the inventors have found, by measurement, that the positions of the observed emission regions in spectrum PS1 have a temperature dependency closely following that of the silicon conduction band edge, whereas, by contrast, transitions between internal energy states of rare earth element ions are known to be temperature invariant.

These observations demonstrate that the $^5D_0$ internal energy state of the $Eu^{3+}$ ions has, in effect, been replaced by a much lower energy state in the silicon conduction band as the starting state for radiative transitions to the $^7F_j$ internal energy states of the $Eu^{3+}$ ions.

An alternative explanation is that radiation emissive transitions occur between the $^7F_j$ energy states and an energy state in the silicon valence band. However, this is not consistent with the observed spectrum because the order of the transitions, and so the order of the emission regions in the spectrum, would then be reversed due to the lower terminal energy state in the valence band, but such reversal is not observed.

FIG. 5b diagrammatically illustrates how the band structure of the silicon host and the internal $^7F_j$ energy states of the $Eu^{3+}$ ions are thought to be aligned. As shown in this Figure, the $^7F_j$ energy states all lie within the energy gap (EG) between the silicon conduction band (CB) and the silicon valence band (VB). Radiative transitions from the conduction band edge $Si_{CB}$ to the internal $^7F_j$ energy states of the $Eu^{3+}$ ions are referenced $T_1$, $T_2$, $T_3$, $T_4$, of which transitions $T_1$, $T_2$ and $T_3$ correspond to the emission regions $R_1$, $R_2$ and $R_3$ respectively in spectrum PS1.

These band-edge modified transitions involve direct interaction between an energy state in the silicon conduction band and the $^7F_j$ energy states of the $Eu^{3+}$ ions, and so they do not rely on indirect energy transfer processes needed in known devices. It is believed that direct involvement of the bulk conduction band continium in place of a single excited energy state (previously the $^5D_0$ state), and non-reliance on indirect energy transfer processes should result in higher effective optical transmission rates, key to the development of efficient emitters, amplifiers and detectors.

At relatively high temperatures, typically above 80K, fast, non-radiative recombination processes in the silicon host tend to compete with the radiative transitions to the internal energy states of the $Eu^{3+}$ ions and, therefore, may mask their effect. This problem can be alleviated by provision of a strain field created by an array of dislocation loops as described with reference to FIG. 1. In effect, the strain field around each dislocation loop of the array creates a three dimensional potential barrier which varies in magnitude inversely as a function of distance from the edge of the dislocation loop. The potential barriers are effective to spatially confine charge carriers and so inhibit their diffusion to point defects in the silicon lattice or a surface where the non-radiative recombination processes usually take place, thereby reducing the masking effect of those processes. At lower temperatures, the non-radiative recombination processes are much slower, reducing or eliminating the need for a strain field.

The LED described with reference to FIG. 1 is particularly beneficial in that it is based on silicon which, as already explained, is becoming an important optoelectronic material from both commercial and technological standpoints. Furthermore, the LED is emissive of radiation in the infra-red wavelength range 1300 nm-1600 nm which is of considerable importance to applications involving the development of optical communication systems.

It will be appreciated that although the optoelectronic device described with reference to FIGS. 1 to 5 is a light emitting diode, the invention embraces other forms of photoemissive device such as lasers and optical amplifiers. In one implementation, a laser in accordance with the invention has a structure similar to that described with reference to FIG. 1, but has an optical cavity formed between fully reflecting and partially reflecting elements (R, $R^1$) (shown in broken outline in FIG. 1) at each end of the device.

The invention also embraces photodetectors, including, but not limited to, photodiodes, avalanche photodiodes, p-i-n photodiodes and Schottky photodiodes. In this case, the photoactive region is situated in either a p-type region or an n-type region of the device and radiation absorptive transitions occur between an energy state of the host semiconductor material and an energy state of the dopant rare earth element ions. A strain field of the kind described with reference to FIG. 1 might be expected to improve efficiency of such radiation absorptive transitions.

If the photoactive region is situated in a p-type region of the device an incident photon having the requisite energy will create transitions in the photoactive region giving rise to additional holes in the valence band. In effect, an electron in the valence band is transferred to a higher internal state of the dopant ions leaving an additional hole in the valence band, generating a photocurrent which can be detected under reverse bias conditions. Alternatively, if the photoactive region is situated in a n-type region of the device, an incident photon having the requisite energy creates transitions in the photoactive region giving rise to additional electrons in the conduction band. In effect, an electron is transferred to the conduction band from an internal energy state of the dopant ions thereby generating a photocurrent which can be detected under forward bias conditions. Expected radiation-absorptive transitions, at relatively low temperatures, up to 80K are illustrated diagrammatically in FIG. 6. As can be seen from this Figure, transitions into the conduction band (the n-type transitions) are absorptive of radiation in the wavelength range 1280 nm to 2000 nm, whereas transitions from the valence band (the p-type transitions) are absorptive of radiation in a different, much wider wavelength range, from 2600 nm to about 9500 nm. These p-type transitions are very temperature sensitive due to the closeness of the internal $Eu^{3+}$ energy states to the silicon valence band, $Si_{VB}$. At higher temperatures, at or close to room temperature, p-type transitions in an even wider wavelength range, from 2600 nm to approximately 25,000 nm, are to be expected. It is envisaged that the photodetector can be selectively designed to detect radiation in a desired wavelength range depending on choice of rare earth semiconductor and doping type.

It will also be appreciated that although the LED described with reference to FIGS. 1 to 5 has a photoactive region containing silicon doped with trivalent europium ions $Eu^{3+}$, the present invention is not limited to these materials. The present invention embraces optoelectronic devices (photoemitters and photodetectors) having a photoactive region containing a different semiconductor material, such as another Group IV indirect band gap semiconductor material e.g. germanium; tin; carbon; silicon/germanium; silicon carbide and their alloys. The invention also embraces different rare earth dopant ions. FIG. 7 shows a photoluminescence spectrum obtained from the LED described with reference to FIG. 1 in which the photoactive region 14 contains silicon doped with trivalent ions of the rare earth element ytterbium, $Yb^{3+}$ instead of trivalent europium ions. FIGS. 8a and 8b diagrammatically illustrate radiative transitions associated with $Yb^{3+}$ ions. These Figures are similar to FIGS. 5a and 5b respectively; that is, FIG. 8a diagrammatically illustrates radiative transitions between internal energy states of $Yb^{3+}$ ions, whereas FIG. 8b diagrammatically illustrates how the band structure of the silicon host and the internal, $^2F_{7/2}$, energy states of the $Yb^{3+}$ ions are thought to be aligned, and shows radiative transitions $T_1'$, $T_2'$, $T_3'$ and $T_4'$ that can occur. The observed transitions (to one or more of the $^2F_{7/2}$ states) are again red-shifted, by 0.295 eV, from the expected internal transitions, corresponding to the wavelength range 1000 nm to 1050 nm. Again, the device is emissive of radiation in the technologically significant infra-red wavelength range 1300 nm to 1600 nm. FIG. 9 is similar to FIG. 6 and diagrammatically illustrates expected radiation-absorptive transitions, at relatively low temperatures, up to 80K, from the $^2F_{7/2}$ states of $Yb^{3+}$ ions to the silicon conduction band edge $Si_{CB}$ (for the case of n-type material) and from the silicon valence band edge $Si_{VB}$ to the $^2F_{7/2}$ states of the $Yb^{3+}$ ions (for the case of p-type material). When used as a photodetector, the device is absorptive of radiation in the wavelength range 1280 nm to 1360 nm (n-type transitions) and in the wavelength range 6500 nm to 9500 nm (p-type transitions). At higher temperature, at or close to room temperature, p-type transitions in a wider energy range, from 6000 nm to approximately 25,000 nm are to be expected.

FIG. 10 shows photovoltage responses, plotted diagrammatically against inverse temperature, obtained from $S_i:Eu^{3+}$ and $S_i:Yb^{3+}$ LEDs of the kind described with reference to FIG. 1, but operating in unbiased photovoltaic mode. The diodes were illuminated through the window in the back of the device and the excitation energy was well below the silicon band gap energy, that is, in the infra-red, with a pass band of 1.8 μm to 3.5 μm. This was accomplished using a tungsten lamp having a thick germanium filter giving a sharp 1.8 μm long pass response. Associated quartz optics and cryostat windows provide a soft cut-off at around 3.5 μm.

Both plots show a thermally-activated photoresponse up to room temperature. A control silicon LED processed identically apart from the rare earth element doping, and measured under the same illumination conditions, gave no detectable response.

In each case, the primary activation energy of the photoresponse was obtained from the slope of the high temperature, linear region of the respective plot. For the $Eu^{3+}$-doped device, the primary excitation energy was determined, by measurement, to be 0.477 eV, equivalent to 2600 nm. This value matches the predicted, highest energy transition $(Si_{VB} \rightarrow {}^7F_4)$, for p-type, shown in FIG. 6.

For the $Yb^{3+}$-doped device, the primary activation energy was determined, by measurement, to be 0.190 eV, equivalent to 6500 nm. This value matches the predicted, highest energy transition $(Si_{VB} \rightarrow {}^2F_{7/2}(3"))$, for p-type, shown in FIG. 8.

These results provide independent experimental verification of the band-edge modified transitions shown in FIGS. 6 and 9, and demonstrate the potential of band-edge modified devices as photodetectors, even though the LEDs used to obtain the measurements shown in FIG. 10 were not specifically designed as such.

In a typical implementation, an optoelectronic device according to the invention is incorporated in an optoelectronic integrated circuit; for example, an integrated silicon photonic platform, such as a silicon-on-insulator 'waveguide' platform. An example of such an implementation is illustrated in FIGS. 11(a) and 11(b).

As shown diagrammatically in FIG. 11(a), an optoelectronic integrated circuit 90 comprises a photoemitter 91 coupled by a planar waveguide 92 to a photodetector 93. The photoemitter 91 and/or the photodetector 93 are in accordance with the invention, and could have the form of the preferred embodiments described with reference to FIGS. 1 to 10.

As shown in more detail in FIG. 11(b), the photoemitter 91, the planar waveguide 92 and the photodetector 93 are formed on an electrically insulating layer 94 of silicon dioxide buried in a silicon substrate 95. The planar waveguide 92 has a silicon waveguide region 96 bounded on one side by the electrically insulating layer 94 and on the other side by a region 97 having a lower refractive index than that of region 96. Oxide-filled trenches T are provided to isolate region 98 for the contacts to the photoemitter 91 and to isolate region 99 for the contacts to the photodetector 93 and similar isolating trenches are provided to separate the photoemitter 91 and the photodetector 93 from region 97 of the planar waveguide 92. The refractive index of region 97 is selected so that, in operation of the circuit, radiation emitted by the photoemitter 91 is guided along waveguide region 96 for detection by photodetector 93.

The invention claimed is:

1. An optoelectronic device including a photoactive region containing semiconductor material doped with ions of a rare earth element such that, in operation, characteristic transitions associated with internal energy states of the dopant ions are modified by direct interaction of those internal energy states with an energy state from the conduction and/or valence band of the semiconductor material; and
a junction bounded by a p-type semiconductor region and/or a n-type semiconductor region, and
wherein said photoactive region is situated in a said p-type or n-type region.

2. An optoelectronic device including a photoactive region containing semiconductor material doped with ions of a rare earth element, said ions having energy states that lie within a forbidden band between the conduction and valence bands of the semiconductor material, and being capable, in operation, of undergoing radiation emissive or radiation absorptive transitions between an energy band of the semiconductor material and a said energy state of the dopant ions; and
a junction bounded by a p-type semiconductor region and/or a n-type semiconductor region, and
wherein said photoactive region is situated in a said p-type or n-type region.

3. A device as claimed in claim 1 wherein said semiconductor material is an indirect band gap semiconductor material.

4. A device as claimed in claim 3 wherein said semiconductor material is silicon.

5. A device as claimed in claim 1 wherein said ions of a rare earth element are trivalent europium ions, $Eu^{3+}$.

6. A device as claimed in claim 1 wherein said ions of a rare earth element are trivalent ytterbium ions, $Yb^{3+}$.

7. A device as claimed in claim 5 wherein said photoactive region contains silicon doped with trivalent europium ions, $Eu^{3+}$ and being capable, in operation, of undergoing radiative transitions from an energy state in the silicon conduction band to one or more of the $^7F_j$ states of the trivalent $Eu^{3+}$ ions, where j=0, 1, 2, 3, 4.

8. A device as claimed in claim 6 wherein said photoactive region contains silicon doped with trivalent ytterbium ions, $Yb^{3+}$ and being capable, in operation, of undergoing radiative transitions from an energy state in the silicon conduction band to one or more of the $^2F_{7/2}$ states of the trivalent $Yb^{3+}$ ions.

9. A device as claimed in claim 1 being a photoemitter.

10. A device as claimed in claim 9 including a p-n junction defined by a p-type semiconductor region and a n-type semiconductor region and where said photoactive region is situated in one or another of said p-type and n-type semiconductor regions.

11. A device as claimed in claim 10 in the form of a light emitting diode.

12. A device as claimed in claim 11 wherein said photoactive region contains silicon doped with trivalent europium ions, $Eu^{3+}$ and being emissive of radiation in the wavelength range 1300 nm to 1600 nm.

13. A device as claimed in claim 11 wherein said photoactive region contains silicon doped with trivalent ytterbium ions, $Yb^{3+}$ and being emissive of radiation in the wavelength range 1200 nm to 1600 nm.

14. A device as claimed in claim 10 in the form of an optical amplifier.

15. A device as claimed in claim 14 wherein the optical amplifier is a laser, said p-n junction being provided with fully and partially reflective elements to form an optical cavity.

16. A device as claimed in claim 1 being a photodetector.

17. A device as claimed in claim 16 wherein the photodetector is a photodiode having a junction bounded by a n-type semiconductor region, said photoactive region is situated in said n-type semiconductor region, and being capable, in operation, of undergoing radiation absorptive transitions between a said energy state of the dopant ions and an energy state in the conduction band of said semiconductor material.

18. A device as claimed in claim 17 wherein said semiconductor material is silicon and said dopant ions are trivalent europium ions, and being absorptive of radiation in the wavelength range 1280 nm to 2000 nm.

19. A device as claimed in claim 17 wherein said semiconductor material is silicon and said dopant ions are trivalent ytterbium ions, and being absorptive of radiation in the wavelength range 1280 nm to 1360 nm.

20. A device as claimed in claim 16 wherein the photodetector is a photodiode having a junction bounded by a p-type semiconductor region, said photoactive region is situated in said p-type semiconductor region, and being capable, in operation, of undergoing radiation absorptive transitions between an energy state in the valence band of said semiconductor material and a said energy state of the dopant ions.

21. A device as claimed in claim 20 wherein said semiconductor is silicon and said dopant ions are trivalent europium ions, and being absorptive of radiation in the wavelength range 2600 nm to about 25000 nm.

22. A device as claimed in claim 20 wherein said semiconductor is silicon and said dopant ions are trivalent ytterbium ions, and being absorptive of radiation in the wavelength range 6000 nm to 25000 nm.

23. A device as claimed in claim 17 wherein the junction is a p-n junction.

24. A device as claimed in claim 16 selected from a photodiode, an avalanche photodiode, a p-i-n photodiode and a Schottky photodiode.

25. A device as claimed in claim 1 wherein said semiconductor material is an indirect band gap material and incorporates a strain field effective to spatially confine, and thereby suppress non-radiative recombination of charge carriers that would otherwise compete with transitions between a said energy state of the semiconductor material and a said energy state of the dopant ions.

26. A device as claimed in claim 25 wherein said strain field is created by an array of dislocation loops.

27. An optoelectronic integrated circuit including at least one optoelectronic device according to claim 1.

28. An optoelectronic integrated circuit as claimed in claim 27 wherein said at least one optoelectronic device includes a photoemitter and/or optical amplifier and/or a photodetector and including a planar waveguide for coupling the photoemitter to the photodetector.

29. An optoelectronic integrated circuit as claimed in claim 28 wherein said photoemitter, said optical amplifier, said photodetector and said planar waveguide are formed on a silicon substrate.

30. A device as claimed in claim 2 wherein said semiconductor material is an indirect band gap semiconductor material.

31. A device as claimed in claim 30 wherein said semiconductor material is silicon.

32. A device as claimed in claim 2 wherein said ions of a rare earth element are trivalent europium ions, $Eu^{3+}$.

33. A device as claimed in claim 2 wherein said ions of a rare earth element are trivalent ytterbium ions, $Yb^{3+}$.

34. A device as claimed in claim 32 wherein said photoactive region contains silicon doped with trivalent europium ions, $Eu^{3+}$ and being capable, in operation, of undergoing radiative transitions from an energy state in the silicon conduction band to one or more of the $^7F_j$ states of the trivalent $Eu^{3+}$ ions, where j=0, 1, 2, 3, 4.

35. A device as claimed in claim 33 wherein said photoactive region contains silicon doped with trivalent ytterbium ions, $Yb^{3+}$ and being capable, in operation, of undergoing radiative transitions from an energy state in the silicon conduction band to one or more of the $^2F_{7/2}$ states of the trivalent $Yb^{3+}$ ions.

36. A device as claimed in claim 2 being a photoemitter.

37. A device as claimed in claim 36 including a p-n junction defined by a p-type semiconductor region and a n-type semiconductor region and where said photoactive region is situated in one or another of said p-type and n-type semiconductor regions.

38. A device as claimed in claim 37 in the form of a light emitting diode.

39. A device as claimed in claim 38 wherein said photoactive region contains silicon doped with trivalent europium ions, $Eu^{3+}$ and being emissive of radiation in the wavelength range 1300 nm to 1600 nm.

40. A device as claimed in claim 38 wherein said photoactive region contains silicon doped with trivalent ytterbium ions, $Yb^{3+}$ and being emissive of radiation in the wavelength range 1200 nm to 1600 nm.

41. A device as claimed in claim 37 in the form of an optical amplifier.

42. A device as claimed in claim 41 wherein the optical amplifier is a laser, said p-n junction being provided with fully and partially reflective elements to form an optical cavity.

43. A device as claimed in claim 2 being a photodetector.

44. A device as claimed in claim 43 wherein the photodetector is a photodiode having a junction bounded by a n-type semiconductor region, said photoactive region is situated in said n-type semiconductor region, and being capable, in operation, of undergoing radiation absorptive transitions between a said energy state of the dopant ions and an energy state in the conduction band of said semiconductor material.

45. A device as claimed in claim 44 wherein said semiconductor material is silicon and said dopant ions are trivalent europium ions, and being absorptive of radiation in the wavelength range 1280 nm to 2000 nm.

46. A device as claimed in claim 44 wherein said semiconductor material is silicon and said dopant ions are trivalent ytterbium ions, and being absorptive of radiation in the wavelength range 1280 nm to 1360 nm.

47. A device as claimed in claim 43 wherein the photodetector is a photodiode having a junction bounded by a p-type semiconductor region, said photoactive region is situated in said p-type semiconductor region, and being capable, in operation, of undergoing radiation absorptive transitions between an energy state in the valence band of said semiconductor material and a said energy state of the dopant ions.

48. A device as claimed in claim 47 wherein said semiconductor is silicon and said dopant ions are trivalent europium ions, and being absorptive of radiation in the wavelength range 2600 nm to about 25000 nm.

49. A device as claimed in claim 47 wherein said semiconductor is silicon and said dopant ions are trivalent ytterbium ions, and being absorptive of radiation in the wavelength range 6000 nm to 25000 nm.

50. A device as claimed claim 44 wherein the junction is a p-n junction.

51. A device as claimed claim 43 selected from a photodiode, an avalanche photodiode, a p-i-n photodiode and a Schottky photodiode.

52. A device as claimed in claim 2 wherein said semiconductor material is an indirect band gap material and incorporates a strain field effective to spatially confine, and thereby suppress non-radiative recombination of charge carriers that would otherwise compete with transitions between a said energy state of the semiconductor material and a said energy state of the dopant ions.

53. A device as claimed in claim 52 wherein said strain field is created by an array of dislocation loops.

54. An optoelectronic integrated circuit including at least one optoelectronic device according to claim 2.

55. An optoelectronic integrated circuit as claimed in claim 54 wherein said at least one optoelectronic device includes a photoemitter and/or optical amplifier and/or a photodetector and including a planar waveguide for coupling the photoemitter to the photodetector.

56. An optoelectronic integrated circuit as claimed in claim 55 wherein said photoemitter, said optical amplifier, said photodetector and said planar waveguide are formed on a silicon substrate.

* * * * *